United States Patent
Kim et al.

(10) Patent No.: US 11,443,938 B2
(45) Date of Patent: Sep. 13, 2022

(54) SUBSTRATE PROCESSING APPARATUS AND SUBSTRATE PROCESSING METHOD

(71) Applicant: SEMES CO., LTD., Chungcheongnam-do (KR)

(72) Inventors: Boong Kim, Cheonan-si (KR); Joo Jib Park, Asan-si (KR); Woo Young Kim, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 924 days.

(21) Appl. No.: 16/159,839

(22) Filed: Oct. 15, 2018

(65) Prior Publication Data
US 2019/0115210 A1    Apr. 18, 2019

(30) Foreign Application Priority Data
Oct. 16, 2017   (KR) .......................... 10-2017-0133730

(51) Int. Cl.
| | |
|---|---|
| *H01L 21/67* | (2006.01) |
| *H01L 21/02* | (2006.01) |
| *B08B 7/00* | (2006.01) |
| *B08B 3/08* | (2006.01) |

(52) U.S. Cl.
CPC .......... *H01L 21/02101* (2013.01); *B08B 3/08* (2013.01); *B08B 7/0021* (2013.01); *H01L 21/6719* (2013.01); *H01L 21/67034* (2013.01); *H01L 21/67253* (2013.01)

(58) Field of Classification Search
None
See application file for complete search history.

(56) References Cited

U.S. PATENT DOCUMENTS

| | | | | |
|---|---|---|---|---|
| 2006/0065287 | A1* | 3/2006 | Kroeker | H01L 21/67126 134/21 |
| 2008/0276611 | A1* | 11/2008 | Gaile | B61D 3/10 60/545 |
| 2013/0025155 | A1* | 1/2013 | Kim | H01L 21/67748 34/516 |

FOREIGN PATENT DOCUMENTS

| | | |
|---|---|---|
| KR | 10-2005-0019129 A | 2/2005 |
| KR | 1020070055154 A | 5/2007 |
| KR | 10-0885496 B1 | 2/2009 |
| KR | 1020100013124 A | 2/2010 |
| KR | 10-1224736 B1 | 1/2013 |
| KR | 101329304 B1 | 11/2013 |
| KR | 10-1394456 B1 | 5/2014 |

(Continued)

*Primary Examiner* — Mikhail Kornakov
*Assistant Examiner* — Ryan L Coleman
(74) *Attorney, Agent, or Firm* — Li & Cai Intellectual Property (USA) Office (57) ABSTRACT

A substrate processing apparatus and a substrate processing method are provided. The substrate processing apparatus includes a chamber having a first housing and a second housing that are combined with each other to form a processing space inside, and a housing actuator that moves the first housing to open or close the processing space. The housing actuator includes a plurality of cylinder units coupled to the first housing, a fluid supplier that supplies a fluid for operating the plurality of cylinder units, and a deviation corrector that corrects an operation deviation between the plurality of cylinder units. The deviation corrector corrects the operation deviation between the plurality of cylinder units coupled to the chamber, thereby minimizing particles that are generated when the chamber is opened/closed.

9 Claims, 9 Drawing Sheets

(56) References Cited

FOREIGN PATENT DOCUMENTS

| KR | 10-1540409 | B1 | 7/2015 |
| KR | 101591959 | B1 | 2/2016 |
| KR | 10-2018-0045961 | A | 5/2018 |
| KR | 10-1874901 | B1 | 7/2018 |

* cited by examiner

SUBSTRATE PROCESSING APPARATUS AND SUBSTRATE PROCESSING METHOD

CROSS-REFERENCE TO RELATED APPLICATIONS

A claim for priority under 35 U.S.C. § 119 is made to Korean Patent Application No. 10-2017-0133730 filed on Oct. 16, 2017, in the Korean Intellectual Property Office, the entire contents of which are hereby incorporated by reference.

BACKGROUND

Embodiments of the inventive concept described herein relate to a substrate processing apparatus and method, and more particularly, relate to a substrate processing apparatus including a chamber having a processing space that is opened or closed by cylinders, and a substrate processing method using the same.

Semiconductor device manufacturing processes include a cleaning process of removing residual contaminants on a substrate. In the cleaning process, a chemical process of removing the contaminants on the substrate by supplying a chemical onto the substrate, a rinse process of removing the chemical on the substrate by supplying a rinsing solution onto the substrate, and a dry process of drying the rinsing solution remaining on the substrate are performed in a serial order.

The dry process is performed by replacing the rinsing solution on the substrate with an organic solvent, supplying a supercritical fluid onto the substrate, and dissolving the organic solvent in the supercritical fluid to separate the organic solvent from the substrate.

In general, fluid used in a supercritical process is maintained in a supercritical state at high pressure higher than the atmospheric pressure, and therefore the pressure inside a chamber for performing a process using the supercritical fluid is maintained at high pressure.

A generally-used supercritical processing chamber has an upper housing and a lower housing. The upper housing is fixed and the lower housing is moved up and down by a plurality of cylinder units. In order to maintain the pressure inside the processing chamber at high pressure during processing, the cylinder units continually apply force to the lower housing to allow the lower housing and the upper housing to be brought into close contact with each other. The plurality of cylinder units are connected to different regions of the lower housing to simultaneously apply driving forces to the lower housing.

The same fluid supply source supplies fluid to the plurality of cylinder units. Although the same amount of fluid is generally supplied into the plurality of cylinder units, the operation displacements of the cylinder units may differ from one another due to a slight difference in mechanical structure or various external environmental factors. When the operation displacement of any one cylinder unit differs from those of the other cylinder units, the lower housing is moved upward in an inclined state. Therefore, the entire regions of the lower housing and the upper housing fail to make contact with each other at the same time, and any specific region of the lower housing makes contact with the upper housing earlier than the other regions of the lower housing. Due to this, particles are generated. The particles are introduced into the supercritical processing chamber and attached to the substrate. Furthermore, the region making contact with the upper housing earlier than the other regions is more rapidly worn down than the other regions.

SUMMARY

Embodiments of the inventive concept provide a substrate processing apparatus and method for correcting an operation deviation between a plurality of cylinder units coupled to a supercritical processing chamber, thereby minimizing particles that are generated when the supercritical processing chamber is opened or closed.

Aspects of the inventive concept are not limited thereto, and any other aspects not mentioned herein will be clearly understood from the following description by those skilled in the art to which the inventive concept pertains.

According to an aspect of an embodiment, an apparatus for processing a substrate includes a chamber having a first housing and a second housing that are combined with each other to form a processing space inside, and a housing actuator that moves the first housing to open or close the processing space. The housing actuator includes a plurality of cylinder units coupled to the first housing, a fluid supply unit that supplies a fluid for operating the plurality of cylinder units, and a deviation correction unit that corrects an operation deviation between the plurality of cylinder units.

Each of the plurality of cylinder units may include a cylinder coupled to the first housing, a rod coupled to the second housing, and a piston that is provided inside the cylinder and connected to the rod and that divides the inside of the cylinder into a first space and a second space.

The fluid supply unit may include a first line connected to the first spaces to supply the fluid into the first spaces or retrieve the fluid from the first spaces and a second line connected to the second spaces to supply the fluid into the second spaces or retrieve the fluid from the second spaces. Each of the first and second lines may include an integrated line connected to a fluid supply source and a plurality of branch lines that branch from the integrated line and that are connected to the cylinders, respectively.

The plurality of branch lines may include a plurality of first branch lines that branch from the integrated line via a first branch valve on the integrated line and a plurality of second branch lines that branch from each of the first branch lines via a second branch valve on the first branch line.

The deviation correction unit may measure operating states of the cylinder units and may control the fluid flowing into or out of the first or second space according to measurement values.

The deviation correction unit may include measurement devices that measure operating states of the cylinder units, respectively, when the first housing is moved, a plurality of control lines connected to the branch lines of the first line, respectively, each control line having a control valve installed thereon, and a controller that receives measurement values from the measurement devices and controls the control valves based on the measurement values to control amounts of the fluid flowing through the branch lines of the first line.

The branch lines may be configured such that the processing space is closed when the fluid flows into the second spaces.

The control lines may be drain lines that drain part of the fluid flowing through the branch lines.

The branch lines may be configured such that the processing space is closed when the fluid flows into the second spaces, and the control lines may be drain lines that drain part of the fluid flowing through the branch lines.

The branch lines may be configured such that the processing space is closed when the fluid flows into the second spaces, and the control lines may be auxiliary supply lines that supply the fluid into the branch lines to increase amounts of the fluid flowing through the branch lines.

According to another aspect of an embodiment, an apparatus for processing a substrate includes a chamber having a first housing and a second housing that are combined with each other to form a processing space inside, a support unit that supports the substrate inside the processing space, a fluid supply line that supplies a supercritical fluid into the processing space, a drain line that drains the supercritical fluid inside the processing space, and a housing actuator that moves the first housing to open or close the processing space. The housing actuator includes a plurality of cylinder units coupled to the first housing, a fluid supply unit that supplies a fluid for operating the plurality of cylinder units, and a deviation correction unit that corrects an operation deviation between the plurality of cylinder units.

Each of the cylinder units may include a cylinder coupled to the first housing, a rod coupled to the second housing, and a piston that is provided inside the cylinder and connected to the rod and that divides the inside of the cylinder into a first space and a second space.

The fluid supply unit may include a first line connected to the first spaces to supply the fluid into the first spaces or retrieve the fluid from the first spaces and a second line connected to the second spaces to supply the fluid into the second spaces or retrieve the fluid from the second spaces. Each of the first and second lines may include an integrated line connected to a fluid supply source and a plurality of branch lines that branch from the integrated line and that are connected to the cylinders, respectively.

The deviation correction unit may include measurement devices that measure operating states of the cylinder units, respectively, when the first housing is moved, a plurality of control lines connected to the branch lines of the first line, respectively, each control line having a control valve installed thereon, and a controller that receives measurement values from the measurement devices and controls the control valves based on the measurement values to control amounts of the fluid flowing through the branch lines of the first line.

According to another aspect of an embodiment, a method for processing a substrate includes opening/closing a processing space formed by a first housing and a second housing, by using a plurality of cylinder units, and correcting an operation deviation between the plurality of cylinder units by measuring operating states of the plurality of cylinder units and controlling amounts of fluid flowing into or out of the plurality of cylinder units when the operation deviation occurs.

The cylinder units may receive the same amount of fluid via branch lines that branch from an integrated line through which the fluid is supplied, and the operation deviation between the plurality of cylinder units may be corrected by controlling amounts of fluid flowing through branch lines, through which the fluid is drained from the plurality of cylinder units, via control lines connected to the branch lines.

The fluid flowing through the branch lines may be drained via the control lines to correct the operation deviation between the plurality of cylinder units.

The fluid may be supplied into the branch lines via control lines to correct the operation deviation between the plurality of cylinder units.

According to embodiments of the inventive concept, by correcting an operation deviation between the plurality of cylinder units coupled to the supercritical processing chamber, it is possible to minimize particles that are generated when the supercritical processing chamber is opened or closed.

According to the embodiments of the inventive concept, contact portions of the first housing and the second housing equally make contact with each other when the supercritical processing chamber is closed, whereby uneven wear of the first housing and the second housing can be prevented.

According to the embodiments of the inventive concept, uneven wear of the cylinder units can be prevented since the operation deviation between the cylinder units is corrected.

According to the embodiments of the inventive concept, the lifetime and the maintenance cycle of the supercritical processing chamber can be increased with an increase in the lifetime of the first housing, the second housing, and the cylinder units.

Effects of the inventive concept are not limited to the above-described effects, and any other effects not mentioned herein may be clearly understood from this specification and the accompanying drawings by those skilled in the art to which the inventive concept pertains.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, embodiments of the inventive concept will be described in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. In the drawings, the dimensions of components are exaggerated or reduced for clarity of illustration.

Substrate processing equipment 100 according to the inventive concept will be described below. The substrate processing equipment 100 may perform a supercritical process of processing a substrate W with a supercritical fluid as a process fluid.

Here, the substrate W has a comprehensive concept that includes all substrates that are used to manufacture semiconductor devices, flat panel displays (FPDs), and other objects having circuit patterns formed on thin films. Examples of the substrate W include various wafers including a silicon wafer, a glass substrate, an organic substrate, and the like.

The term "supercritical fluid" means a phase that simultaneously has properties of gas and liquid at a temperature and pressure above its critical point. The supercritical fluid has a property in that its molecular density is close to that of liquid and its viscosity is close to that of gas. Therefore, the supercritical fluid has excellent diffusion force, permeability, and solubility and thus is advantageous for a chemical reaction. In addition, the supercritical fluid has no surface tension almost at all so that the supercritical fluid does not apply interfacial tension to a microstructure.

The supercritical process is performed using these characteristics of the supercritical fluid. Representative examples of the supercritical process include a supercritical dry process and a supercritical etching process. The following description of the supercritical process will be given based on the supercritical dry process. However, this is only for the convenience of description, and the substrate processing equipment 100 may perform supercritical processes other than the supercritical dry process.

The supercritical dry process may be performed in such a way of drying the substrate W by dissolving a residual organic solvent on a circuit pattern of the substrate W with the supercritical fluid. The supercritical dry process has excellent dry efficiency and has an advantage of preventing pattern collapse. A substance that can be mixed with an organic solvent may be used as the supercritical fluid that is used in the supercritical dry process. For example, supercritical carbon dioxide ($scCO_2$) may be used as the supercritical fluid.

Figure 1:
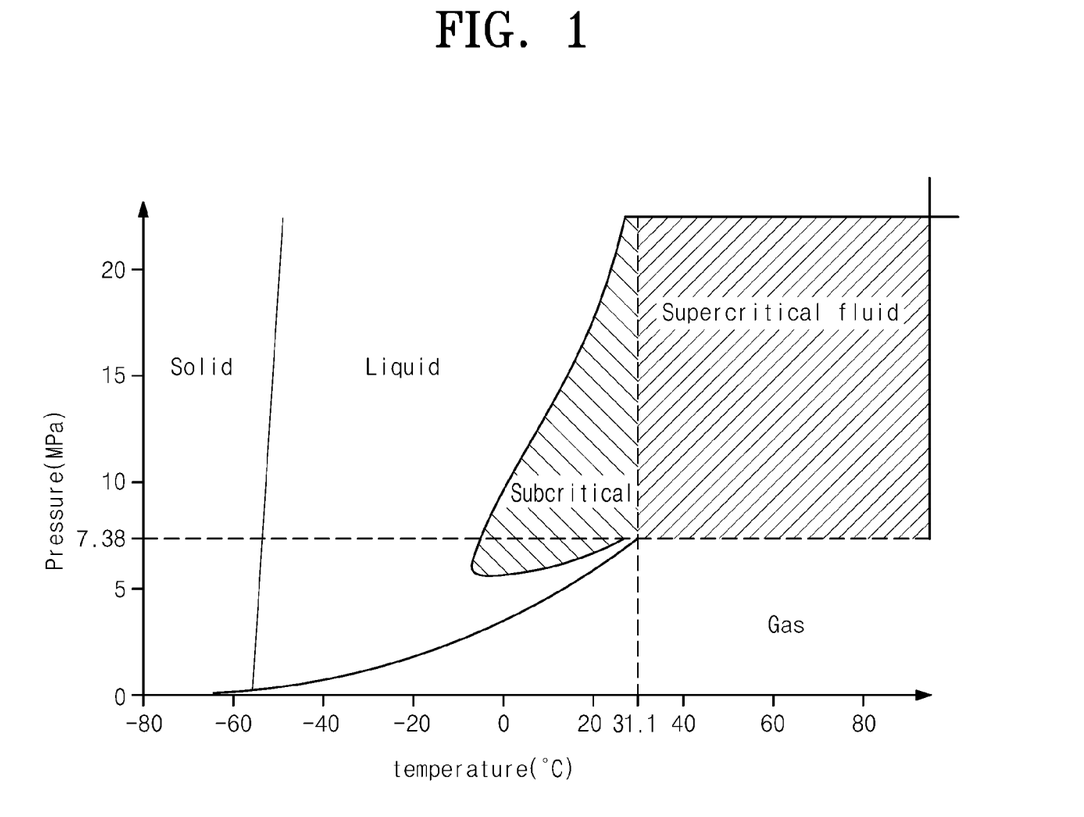
FIG. 1 is a phase diagram of carbon dioxide.

As illustrated in FIG. 1, carbon dioxide has a relatively low critical temperature of 31.1 degrees Celsius and a relatively low critical pressure of 7.38 MPa. Therefore, carbon dioxide may be easily brought into a supercritical state. Furthermore, carbon dioxide has advantages in that a phase change is easily controlled by adjusting temperature and pressure and the cost is low. In addition, carbon dioxide is harmless to a human body because it is not toxic, and has characteristics of incombustibility and inertness. Supercritical carbon dioxide has a diffusion coefficient about 10 to 100 times higher than water or other organic solvents so that the supercritical carbon dioxide is rapidly permeable and can rapidly replace an organic solvent. Further, supercritical carbon dioxide has no surface tension almost at all and therefore has an advantage in drying a substrate W with a fine circuit pattern.

Also, carbon dioxide is advantageous in terms of environmental pollution because carbon dioxide generated as by-products of various chemical reactions is reusable, and carbon dioxide used in a supercritical dry process is reusable by converting the supercritical carbon dioxide into gas to separate an organic solvent from the supercritical carbon dioxide.

Figure 2:
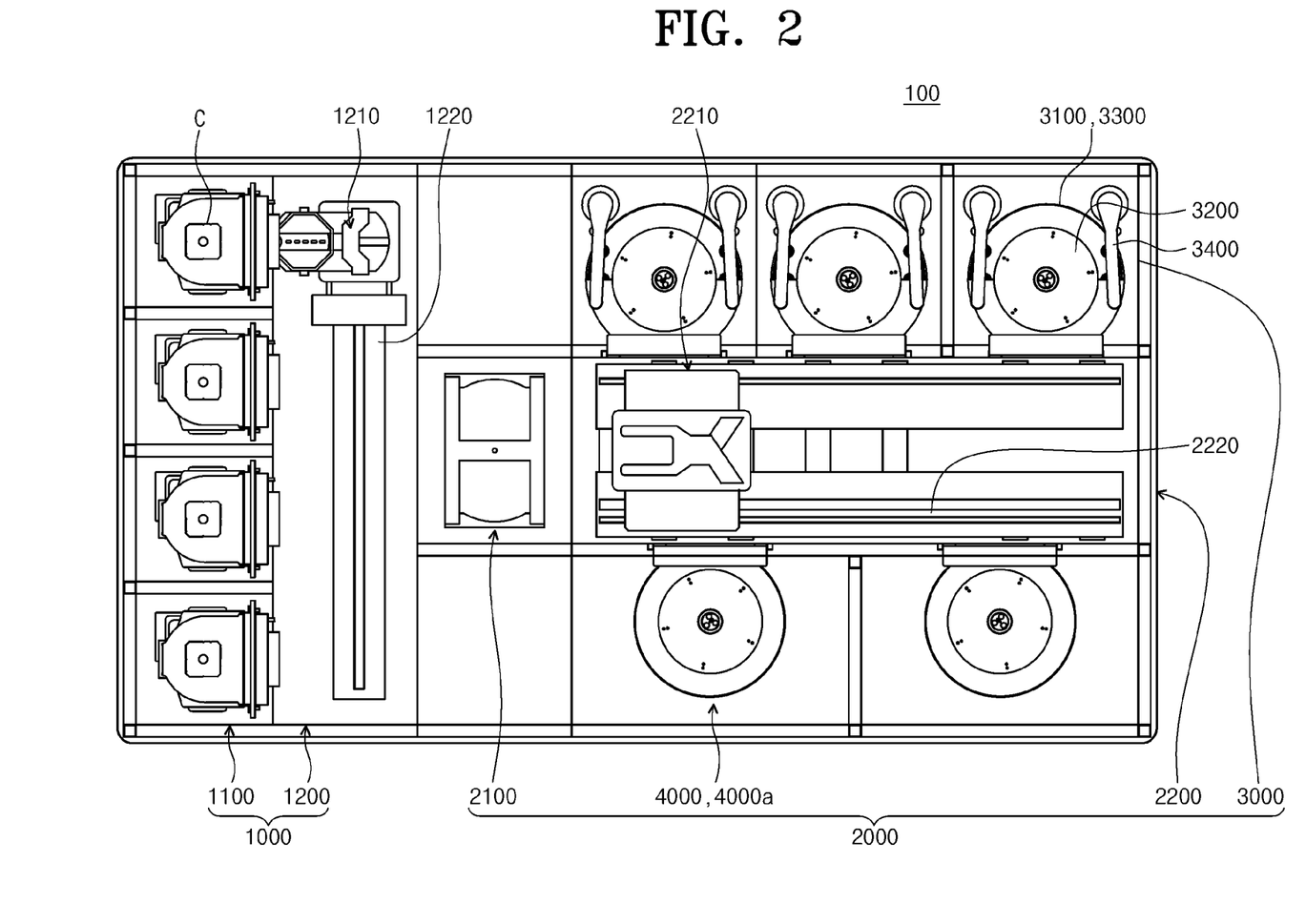
FIG. 2 is a schematic plan view illustrating substrate processing equipment according to an embodiment of the inventive concept.

FIG. 2 illustrates the substrate processing equipment 100 according to an embodiment of the inventive concept. The substrate processing equipment 100 includes an index module 1000 and a process module 2000. The index module 1000 receives substrates W from the outside and transfers the substrates W to the process module 2000. The process module 2000 performs a cleaning process and a supercritical dry process on the substrates W.

The index module 1000, which is an equipment front end module (EFEM), includes a load port 1100 and a transfer frame 1200. Carriers C having the substrates W received therein are placed on the load port 1100. Front opening unified pods (FOUPs) may be used as the carriers C. The carriers C may be carried from the outside to the load port 1100, or vice versa, by an overhead transfer (OHT).

The transfer frame 1200 transfers the substrates W between the carriers C placed on the load port 1100 and the process module 2000. The transfer frame 1200 includes an index robot 1210 and an index rail 1220. The index robot 1210 may move on the index rail 1220 to transfer the substrates W.

The process module 2000 is a module that actually performs processes. The process module 2000 includes a buffer module 2100, a transfer module 2200, a first process chamber 3000, and a second process chamber 4000.

The buffer module 2100 has a space in which the substrates W transferred between the index module 1000 and the process module 2000 temporarily stay. The buffer module 2100 may have a buffer slot in which the substrates W are placed.

The transfer module 2200 transfers the substrates W between the buffer module 2100, the first process chamber 3000, and the second process chamber 4000 that are arranged around the transfer module 2200. The transfer module 2200 may include a transfer robot 2210 and a transfer rail 2220. The transfer robot 2210 may move on the transfer rail 2220 to transfer the substrates W.

The first process chamber 3000 and the second process chamber 4000 may perform cleaning processes. The cleaning processes may be sequentially performed in the first process chamber 3000 and the second process chamber 4000.

For example, among the cleaning processes, a chemical process, a rinse process, and an organic solvent process may be performed in the first process chamber 3000, and a supercritical dry process may be performed in the second process chamber 4000.

The first process chamber 3000 and the second process chamber 4000 may be disposed on sides of the transfer module 2200. For example, the first process chamber 3000 and the second process chamber 4000 may be disposed on different sides of the transfer module 2200 to face each other.

Alternatively, the process module 2000 may include a plurality of first process chambers 3000 and a plurality of second process chambers 4000. The plurality of process chambers 3000 and 4000 may be arranged in a row on the sides of the transfer module 2200, may be stacked on the top and bottom of the transfer module 2200, or may be arranged by a combination thereof.

The arrangement of the first process chambers 3000 and the second process chambers 4000 are not limited to the above-described embodiments and may be appropriately modified in view of various elements, such as the footprint or process efficiency of the substrate processing equipment 100.

The first process chambers 3000 may perform a chemical process, a rinse process, and an organic solvent process. Alternatively, the first process chambers 3000 may perform only some of the processes. Here, the chemical process is a process of removing foreign matter on the substrates W by supplying a cleaning agent onto the substrates W. The rinse process is a process of cleaning the residual cleaning agent on the substrates W by supplying a rinsing agent onto the substrates W. The organic solvent process is a process of replacing the residual rinsing agent between circuit patterns of the substrates W with an organic solvent with low surface tension by supplying the organic solvent onto the substrates W.

Each of the first process chambers 3000 includes a processing vessel 3100, a spin head 3200, a lifting unit 3300, and a spray unit 3400. The processing vessel 3100 has a space in which substrate processing processes are performed. The processing vessel 3100 is open at the top thereof. The processing vessel 3100 has a plurality of bowls (not illustrated). The bowls collect different processing liquids, respectively, which are used in the processes.

The spin head 3200 is disposed inside the processing vessel 3100. The spin head 3200 supports and rotates a substrate W being processed.

The lifting unit 3300 rectilinearly moves the processing vessel 3100 in up/down directions. The height of the processing vessel 3100 relative to the spin head 3200 varies as the processing vessel 3100 vertically moves. When a process is performed, the height of the processing vessel 3100 is controlled depending on the type of processing liquid supplied to the substrate W such that the processing liquid flows into a preset bowl.

The spray unit 3400 supplies a processing liquid onto the substrate W. One or a plurality of spray units 3400 may be provided. In the case where the plurality of spray units 3400 are provided, a chemical, a rinsing liquid, and an organic solvent may be supplied through the different spray units 3400. The chemical may be a liquid that has the property of strong acid or strong base. The rinsing liquid may be pure water. The organic solvent may be a mixture of isopropyl alcohol vapor and an inert gas or may be isopropyl alcohol (IPA).

Figure 3:
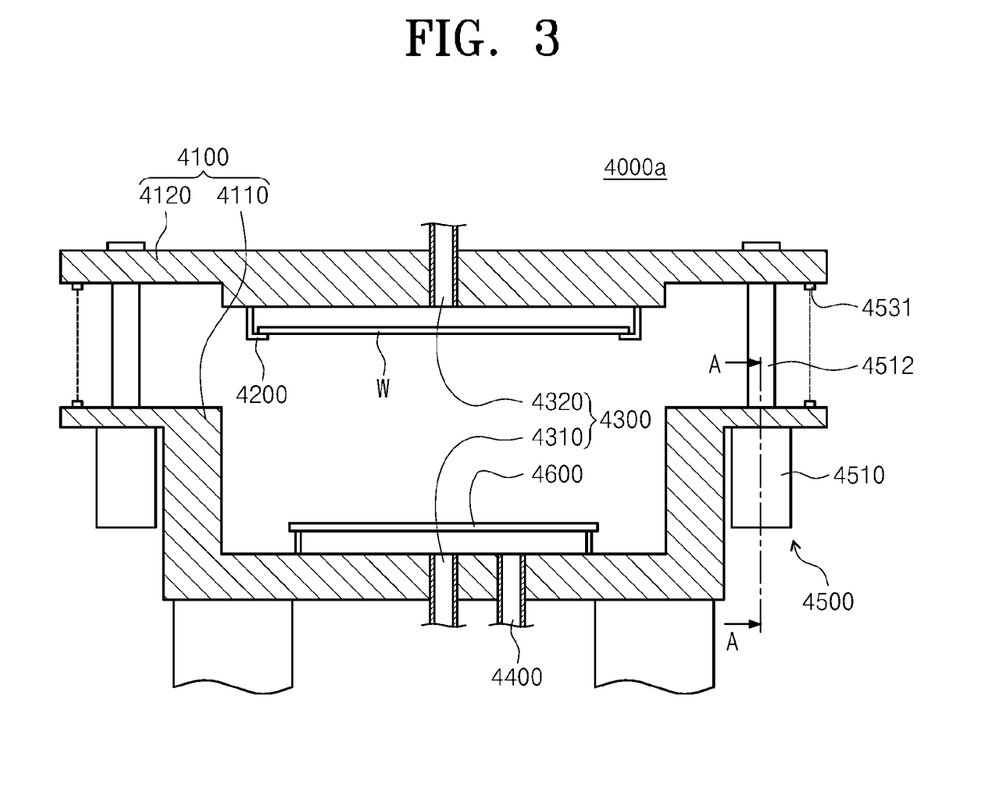
FIG. 3 is a sectional view illustrating a substrate processing apparatus of FIG. 2.

A substrate processing apparatus 4000a according to an embodiment of the inventive concept is illustrated in FIG. 3 as the second process chamber 4000. As illustrated in FIGS. 3 to 6, the substrate processing apparatus 4000a includes a chamber 4100, a support unit 4200, a fluid supply line 4300, a drain line 4400, and a housing actuator 4500.

The chamber 4100 has a space in which a supercritical dry process is performed. The chamber 4100 includes a first housing 4110 and a second housing 4120 that are combined with each other to form a processing space. The first housing 4110 is disposed below the second housing 4120. The first housing 4110 and the second housing 4120 are combined with each other to form the processing space in which a substrate W is processed. The position of the second housing 4120 is fixed. The first housing 4110 is moved up toward the second housing 4120 and brought into close contact with the second housing 4120 by the housing actuator 4500 which will be described below.

The support unit 4200 supports the substrate W in the processing space. The support unit 4200 may be attached to a lower surface of the second housing 4120. The support unit 4200 has a structure in which a plurality of hooks are arranged at predetermined intervals on the lower surface of the second housing 4120. The periphery and the bottom side of the substrate W are placed on the plurality of hooks so that the substrate W is supported on the support unit 4200.

The fluid supply line 4300 supplies a supercritical fluid into the chamber 4100. The fluid supply line 4300 has a first supply line 4310 and a second supply line 4320.

The first supply line 4310 is coupled through the first housing 4110 and supplies the supercritical fluid to the bottom side of the substrate W placed on the support unit 4200. The second supply line 4320 is coupled through the second housing 4120 and supplies the supercritical fluid to the top side of the substrate W placed on the support unit 4200.

Each of the first supply line 4310 and the second supply line 4320 has a valve (not illustrated) installed therein to open/close the internal flow passage. The first supply line 4310 and the second supply line 4320 may have orifices (not illustrated) to supply different amounts of fluid.

When the supercritical fluid is first supplied into the chamber 4100, the pressure inside the chamber 4100 may be lower than the critical pressure, and the supercritical fluid supplied may be liquefied. Therefore, the supercritical fluid is firstly supplied through the first supply line 4310 to prevent the liquefied supercritical fluid from falling onto the substrate W. The second supply line 4320 starts to supply the supercritical fluid when the pressure inside the chamber 4100 reaches the critical pressure.

The drain line 4400 drains the supercritical fluid from the chamber 4100. As mentioned above, the pressure inside the chamber 4100 may be lower than the critical pressure when the supercritical fluid is first supplied into the chamber 4100. The drain line 4400 is coupled through the first housing 4110 to drain the supercritical fluid in a liquid phase.

Figure 5:
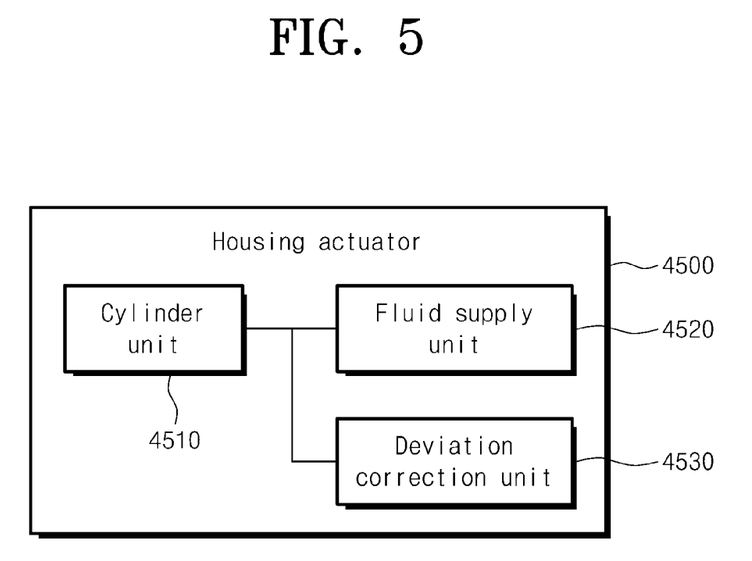
FIG. 5 is a block diagram illustrating a housing actuator of FIG. 3.

The housing actuator 4500 moves the first housing 4110 to open or close the processing space. The housing actuator 4500 includes a cylinder unit 4510, a fluid supply unit L, and a deviation correction unit 4530.

Figure 4:
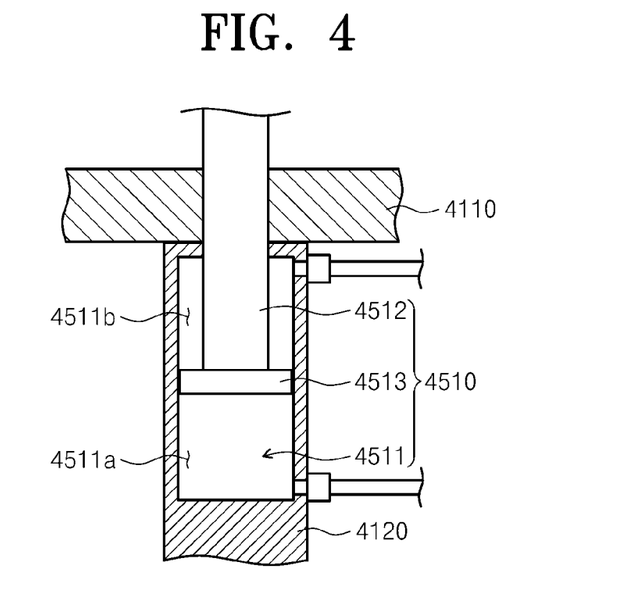
FIG. 4 is a sectional view taken along line A-A of FIG. 3.

A plurality of cylinder units 4510 are provided. According to an embodiment, four cylinder units 4510 may be provided. The cylinder units 4510 are installed on the four corners of the first housing 4110. Each of the cylinder units 4510 includes a cylinder 4511, a rod 4512, and a piston 4513.

The cylinder 4511 is fixed to the first housing 4110. The piston 4513 is provided inside the cylinder 4511 and vertically moved inside the cylinder 4511 by fluid supplied into or drained from the cylinder 4511. One end of the rod 4512 is fixed to the piston 4513, and an opposite end of the rod 4512 is fixed to the second housing 4120. The space inside the cylinder 4511 is divided into a first space 4511a and a second space 4511b by the piston 4513. The first space 4511a and the second space 4511b are on opposite sides of the piston 4513. The first space 4511a may be located below the second space 4511b.

The fluid supply unit L supplies fluid into the cylinder 4511. According to an embodiment, the fluid may be supplied in a liquid phase such that the cylinder unit 4510 is operated by hydraulic pressure. The fluid may also be supplied in a gas phase such that the cylinder unit 4510 is operated by pneumatic pressure.

The fluid supply unit L includes a first line L1 and a second line L2. The first line L1 is connected to the first spaces 4511a to supply fluid into the first spaces 4511a or retrieve the fluid from the first spaces 4511a. The second line L2 is connected to the second spaces 4511b to supply fluid into the second spaces 4511b or retrieve the fluid from the second spaces 4511b.

The first line L1 includes an integrated line 4521a and branch lines 4522a, and the second line L2 includes an integrated line 4521b and branch lines 4522b. The integrated lines 4521a and 4521b are connected to a fluid supply source 4520 that provides hydraulic pressure to the first line L1 and the second line L2.

The branch lines 4522a branch from the integrated line 4521a and are connected to the first spaces 4511a of the cylinders 4511, and the branch lines 4522b branch from the integrated line 4521b and are connected to the second spaces 4511b of the cylinders 4511.

Figure 7:
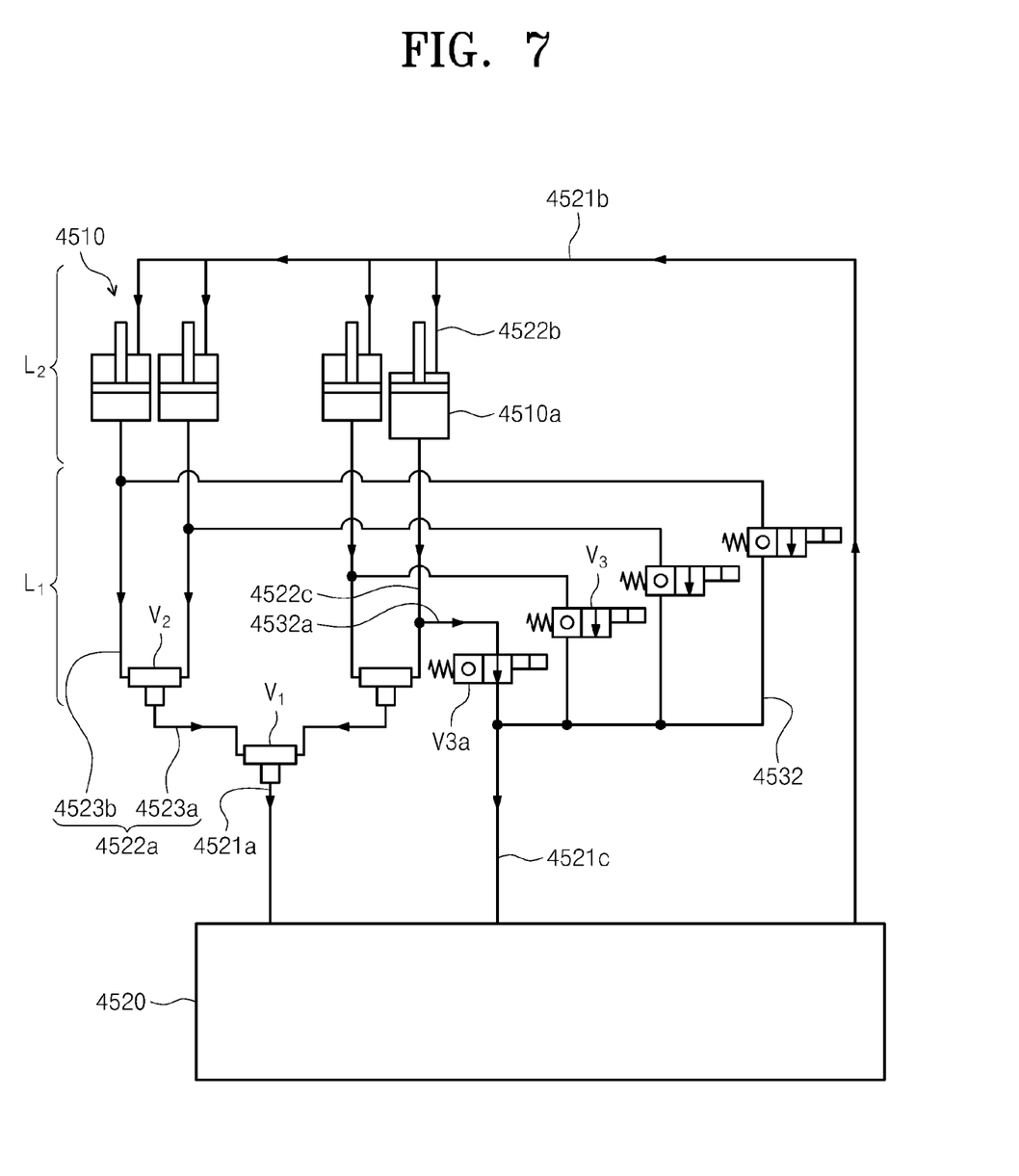
FIG. 7 is a circuit diagram illustrating operations of cylinder units of FIG. 3.

According to an embodiment, each of the branch lines 4522a in the first line L1 includes a first branch line 4523a and second branch lines 4523b. Two first branch lines 4523a branch from the integrated line 4521a via a branch valve V1.

Four second branch lines 4523b are provided. Two of the four second branch lines 4523b branch from one of the first branch lines 4523a via a branch valve V2, and the remaining two second branch lines 4523b branch from the other first branch line 4523a and are directly connected to the first spaces 4511a.

While each of the branch lines 4522a has been described as including the first branch line 4523a and the second branch lines 4523b, four branch lines 4522a may directly branch from the integrated line 4521a and may be directly connected to the first spaces 4511a.

The second line L2 includes the integrated line 4521b and the plurality of branch lines 4522b that extend from the integrated line 4521b to the second spaces 4511b, respectively.

Figure 6:
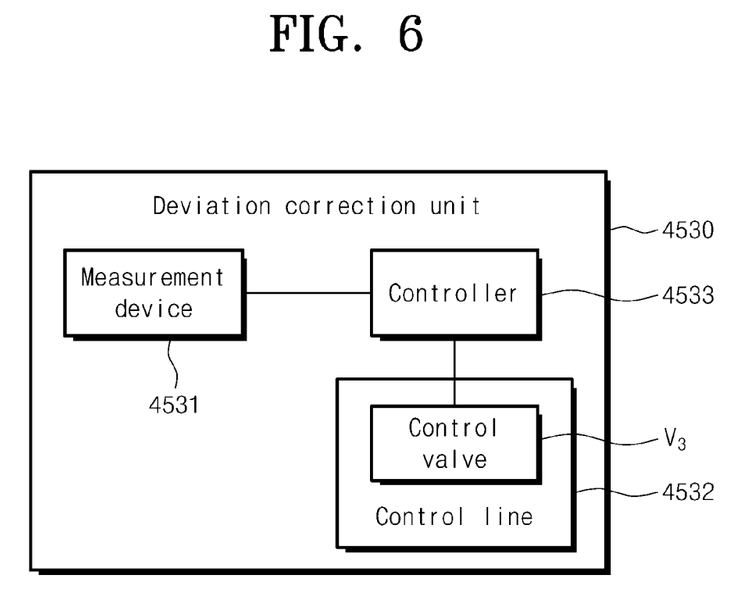
FIG. 6 is a block diagram illustrating a deviation correction unit of FIG. 5.

The deviation correction unit 4530 corrects an operation deviation between the cylinder units 4510 to keep the first housing 4110 horizontal when the first housing 4110 is moved up or down. The deviation correction unit 4530 measures the operating state of the chamber 4100 and controls the amounts of fluid flowing out of the cylinder units 4510 according to the measurement.

The deviation correction unit 4530 includes measurement devices 4531, control lines 4532, and a controller 4533. The measurement devices 4531 measure the operating states of the respective cylinder units 4510. According to an embodiment, the measurement devices 4531 may be implemented with distance sensors and may measure the distances travelled by the rods 4512 in the regions to which the cylinder units 4510 are connected.

For example, measurement instruments in the form of an optical sensor that are disposed on the first housing 4110 to measure the distance from the first housing 4110 to the second housing 4120 may be used as the measurement devices 4531. Various forms of measurement devices 4531 may be selectively provided on the cylinder units 4510 to measure the distances travelled by the pistons 4513.

The control lines 4532 are connected to the second branch lines 4523b, respectively. Control valves V3 are installed on the control lines 4532. The control lines 4532 are connected to the fluid supply source 4520 via an integrated line 4521c.

The controller 4533 receives signals from the measurement devices 4531 and measures the operating states of the cylinder units 4510 based on the received signals. Based on the measurements, the controller 4533 controls opening/closing of the control valves V3 to control the amounts of fluid flowing through the second branch lines 4523b.

A blocking member 4600 has a plate shape and is installed on the first housing 4110. When viewed from above, the blocking member 4600 is located in a position that overlaps the first supply line 4310. The blocking member 4600 blocks the direct supply of the supercritical fluid to the substrate W to prevent the surface of the substrate W from being damaged by the injection pressure of the supercritical fluid.

A method for correcting an operation deviation between the cylinder units 4510 according to operations of the control valves V3 will be described with reference to FIGS. 7 and 8. FIG. 7 is a schematic circuit diagram illustrating a flow of fluid supplied to the cylinder units 4510 when the first housing 4110 is moved up as the fluid in the first spaces 4511a is drained via the second branch lines 4523b.

As illustrated in FIG. 7, fluid is supplied into the second spaces 4511b via the integrated line 4521b. The fluid in the first spaces 4511a is drained via the second branch lines 4523b of the first line L1.

Figure 8:
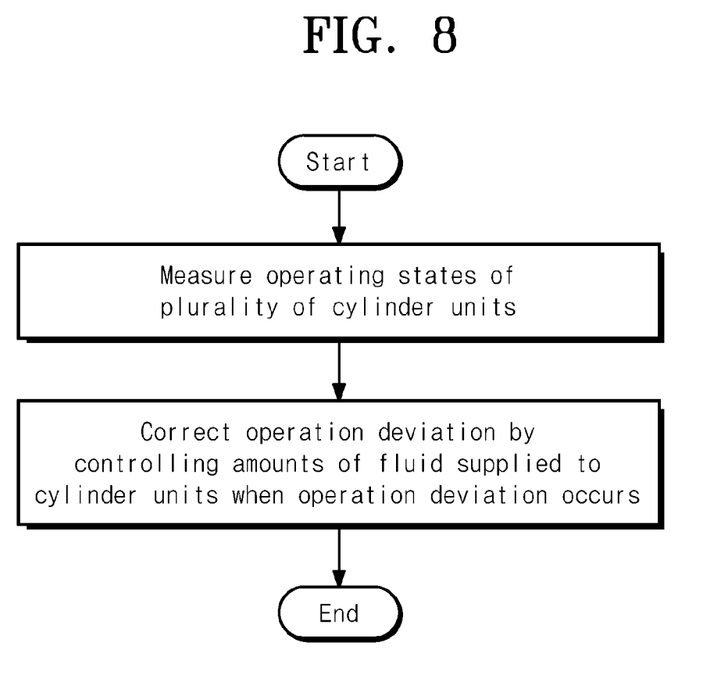
FIG. 8 is a flowchart illustrating a substrate processing method according to an embodiment of the inventive concept.

As illustrated in the flowchart of FIG. 8, the measurement devices 4531 detect the operating states of the cylinder units 4510 and transmit generated signals to the controller 4533. The controller 4533 calculates an operation deviation between the cylinder units 4510 based on the received signals. When any one cylinder unit 4510a moves upward a smaller distance than the other cylinder units 450, the controller 4533 opens a control valve V3a corresponding to the cylinder unit 4510a. Accordingly, the fluid flowing through a second branch line 4522c flows into a control line 4532a.

Consequently, the amount of fluid drained from the first space 4511a via the second branch line 4522c increases, and therefore the operating state of the cylinder unit 4510a is similar to the operating states of the other cylinder units 4510. As a result, the operation deviation between the cylinder units 4510, which is likely to occur when the chamber 400 is closed, is resolved.

Accordingly, the first housing 4110 is moved up while being kept horizontal, and the entire regions of the first housing 4110 and the second housing 4120 are brought into contact with each other at the same time. While the substrate processing apparatus and the substrate processing method have been described above in detail, the inventive concept is not limited to the above-described embodiments and is applicable to all apparatuses in which a dry process is performed using a supercritical fluid.

Figure 9:
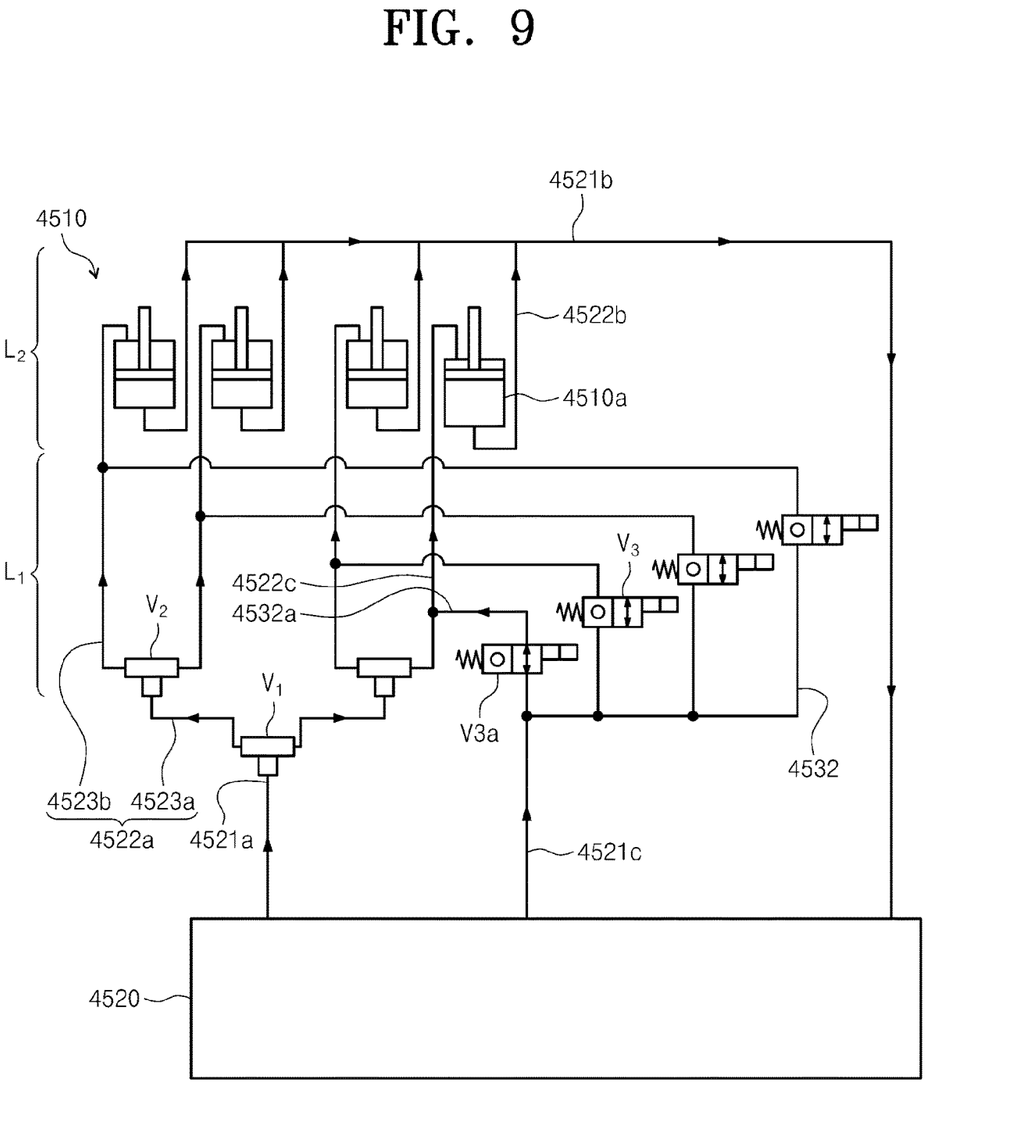
FIGS. 9 to 11 are circuit diagrams illustrating operations of the cylinder units of FIG. 3 according to other embodiments of the inventive concept.

FIGS. 9 to 11 are views illustrating other embodiments of FIG. 7. Referring to FIG. 9, the second branch lines 4523b of the first line L1 are connected to the second spaces 4511b, and the branch lines 4522b of the second line L2 are connected to the first spaces 4511a. Accordingly, the processing space is closed when fluid flows out of the first spaces 4111a via the second line L2.

According to the embodiment illustrated in FIG. 9, when an operation deviation between the cylinder units 4510 occurs, the controller 4533 increases the amount of fluid supplied to the second space 4511b of the cylinder unit 4510a that moves upward a relatively small distance.

The second branch line 4522c of the first line L1 connected to the second space 4511b and the control line 4532a are in communication with each other, and the control valve V3a is opened such that the fluid in the control line 4532a flows into the second branch line 4522c. The control line 4532a functions as an auxiliary supply line for increasing the amount of fluid flowing into the second space 4511b via the second branch line 4522c.

Figure 10:
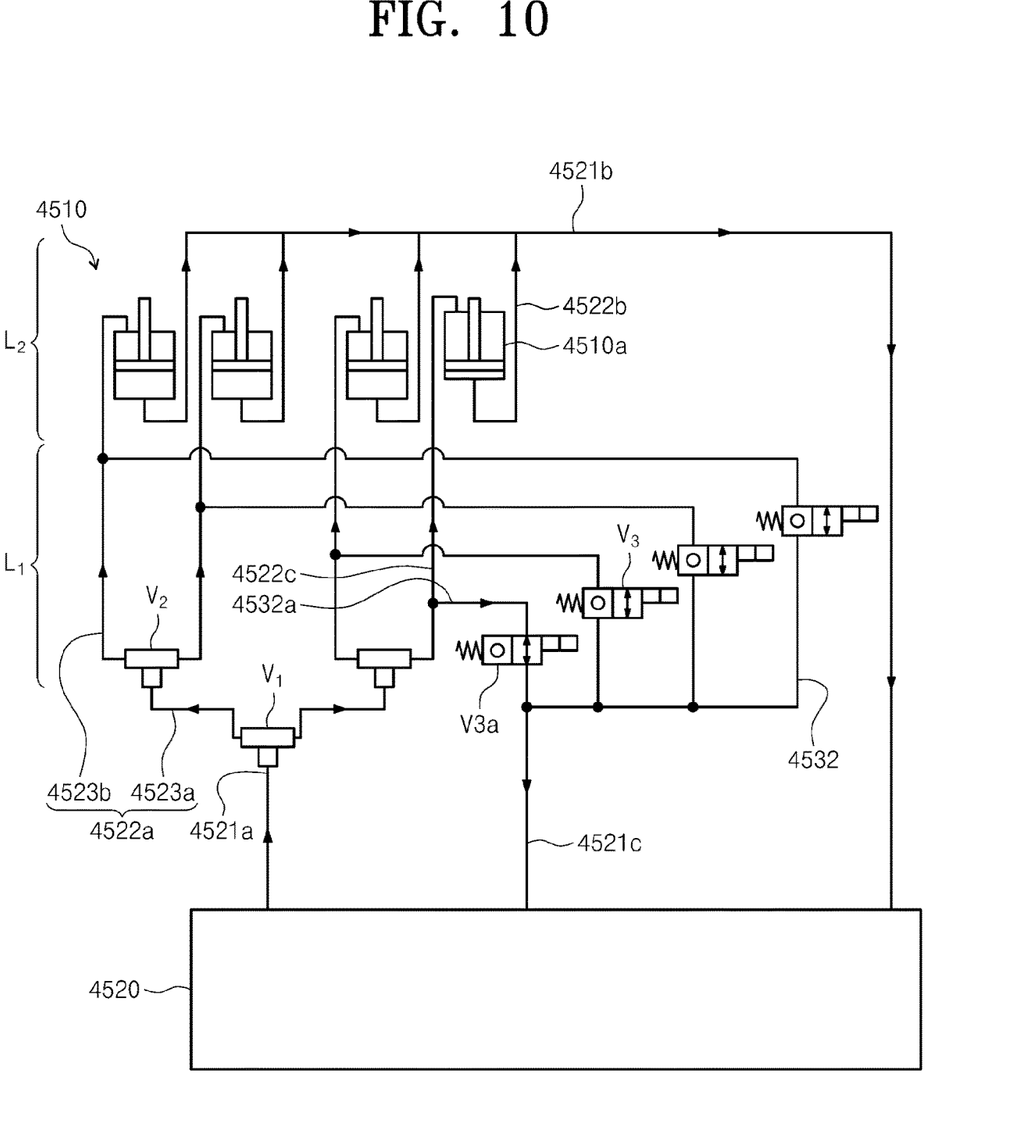

Referring to FIG. 10, the second branch lines 4523b of the first line L1 are connected to the second spaces 4511b, and the branch lines 4522b of the second line L2 are connected to the first spaces 4511a. Accordingly, the processing space is closed when fluid flows out of the first spaces 4111a via the second line L2.

According to the embodiment illustrated in FIG. 10, when an operation deviation between the cylinder units 4510 occurs, the controller 4533 decreases the amount of fluid supplied to the second space 4511b of the cylinder unit 4510a that moves upward a relatively large distance.

The second branch line 4522c of the first line L1 connected to the second space 4511b and the control line 4532a are in communication with each other, and the control valve V3a is opened such that the fluid in the second branch line 4522c flows into the control line 4532a. The control line 4532a functions as a drain line for decreasing the amount of fluid flowing into the second space 4511b via the second branch line 4522c.

Figure 11:
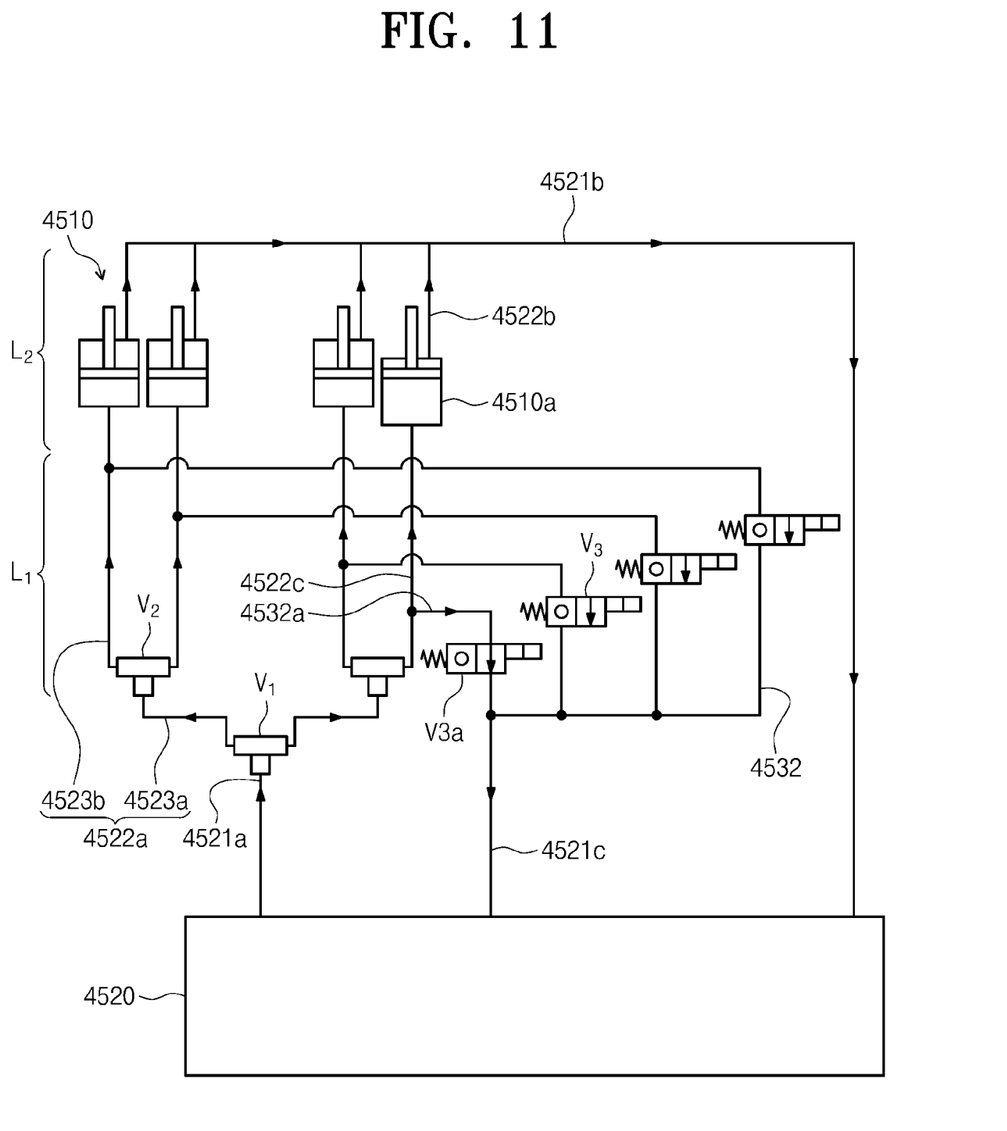

Referring to FIG. 11, the second branch lines 4523b of the first line L1 are connected to the first spaces 4511a, and the branch lines 4522b of the second line L2 are connected to the second spaces 4511b. Accordingly, the processing space is opened when fluid flows into the first spaces 4111a via the first line L1.

According to the embodiment illustrated in FIG. 11, when an operation deviation between the cylinder units 4510 occurs, the controller 4533 decreases the amount of fluid supplied to the first space 4511a of the cylinder unit 4510a that moves downward a relatively large distance.

The second branch line 4522c of the first line L1 connected to the first space 4511a and the control line 4532a are in communication with each other, and the control valve V3a is opened such that the fluid in the second branch line 4522c flows into the control line 4532a. The control line 4532a functions as a drain line for decreasing the amount of fluid flowing into the first space 4511a.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for processing a substrate, the apparatus comprising:
   a chamber having a first housing and a second housing that are combined with each other to form a processing space inside; and
   a housing actuator configured to move the first housing to open or close the processing space,
   wherein the housing actuator includes:
   a plurality of cylinder units coupled to the first housing;
   a fluid supplier configured to supply a fluid for operating the plurality of cylinder units; and
   a deviation corrector configured to correct an operation deviation between the plurality of cylinder units;
   wherein each of the plurality of cylinder units includes:
   a cylinder coupled to the first housing;
   a rod coupled to the second housing; and
   a piston provided inside the cylinder and connected to the rod, the piston being configured to divide the inside of the cylinder into a first space and a second space;
   wherein the fluid supplier includes:
   a first line connected to the first spaces to supply the fluid into the first spaces or retrieve the fluid from the first spaces; and
   a second line connected to the second spaces to supply the fluid into the second spaces or retrieve the fluid from the second spaces, and
   wherein each of the first line and the second line includes:
   an integrated line connected to a fluid supply source; and
   a plurality of branch lines configured to branch from the integrated line, the plurality of branch lines being connected to the cylinders, respectively;
   wherein the plurality of branch lines of the first line include:
   a plurality of first branch lines configured to branch from the integrated line of the first line,
   wherein each of the first branch lines is connected to the integrated line of the first line via a first branch valve; and
   a plurality of second branch lines configured to branch from each of the first branch lines, wherein each of the second branch lines is connected to one of the first branch lines via a second branch valve;
   wherein the deviation corrector comprises control lines connected to the plurality of second branch lines.

2. The apparatus of claim 1, wherein the deviation corrector is configured to measure operating states of the plurality of cylinder units and control the fluid flowing into or out of the first spaces or second spaces according to measurement values.

3. The apparatus of claim 1, wherein the deviation corrector includes:
   measurement devices configured to measure operating states of the cylinder units when the first housing is moved;
   a plurality of control valves, wherein each control valve is installed on one of the control lines of the deviation corrector;
   a controller configured to receive measurement values from the measurement devices and control the control valves based on the measurement values to control amounts of the fluid flowing through the second branch lines of the first line.

4. The apparatus of claim 3, wherein the branch lines of the second line are configured such that the processing space is closed when the fluid flows into the second spaces.

5. The apparatus of claim 3, wherein the control lines are drain lines configured to drain part of the fluid flowing through the plurality of branch lines of the first line.

6. The apparatus of claim 3, wherein the plurality of branch lines of the second line are configured such that the processing space is closed when the fluid flows into the second spaces, and
   wherein the control lines are drain lines configured to drain part of the fluid flowing through the plurality of branch lines of the first line.

7. The apparatus of claim 1, wherein the plurality of branch lines of the first line are configured such that the processing space is closed when the fluid flows into the second spaces, and
   wherein the control lines are auxiliary supply lines configured to supply the fluid into the plurality of branch lines of the first line to increase amounts of the fluid flowing through the plurality of branch lines of the first line.

8. An apparatus for processing a substrate, the apparatus comprising:
   a chamber having a first housing and a second housing that are combined with each other to form a processing space inside;
   a support unit configured to support the substrate inside the processing space;
   a fluid supply line configured to supply a supercritical fluid into the processing space;
   a drain line configured to drain the supercritical fluid inside the processing space; and
   a housing actuator configured to move the first housing to open or close the processing space;
   wherein the housing actuator includes:
   a plurality of cylinder units coupled to the first housing;
   a fluid supplier configured to supply a fluid for operating the plurality of cylinder units; and a deviation corrector configured to correct an operation deviation between the plurality of cylinder units;

wherein each of the plurality of cylinder units includes:

a cylinder coupled to the first housing;

a rod coupled to the second housing; and a piston provided inside the cylinder and connected to the rod, the piston being configured to divide the inside of the cylinder into a first space and a second space;

wherein the fluid supplier includes:

a first line connected to the first spaces to supply the fluid into the first spaces or retrieve the fluid from the first spaces; and a second line connected to the second spaces to supply the fluid into the second spaces or retrieve the fluid from the second spaces, and wherein each of the first line and the second line includes:

an integrated line connected to a fluid supply source; and a plurality of branch lines configured to branch from the integrated line, the plurality of branch lines being connected to the cylinders, respectively;

wherein the plurality of branch lines of the first line include:

a plurality of first branch lines configured to branch from the integrated line of the first line, wherein each of the first branch lines is connected to the integrated line of the first line via a first branch valve; and a plurality of second branch lines configured to branch from each of the first branch lines, wherein each of the second branch lines is connected to one of the first branch lines via a second branch valve;

wherein the deviation corrector comprises control lines connected to the plurality of second branch lines.

9. The apparatus of claim 8, wherein the deviation corrector includes:

measurement devices configured to measure operating states of the cylinder units when the first housing is moved;

a plurality of control valves, wherein each control valve is installed on one of the control lines of the deviation corrector;

a controller configured to receive measurement values from the measurement devices and control the control valves based on the measurement values to control amounts of the fluid flowing through the second branch lines of the first line.

* * * * *